RECEIVER AUTOMATIC TUNING WITH DETUNING MEANS

Filed Sept. 12, 1966 2 Sheets-Sheet 1

RECEIVER AUTOMATIC TUNING WITH DETUNING MEANS

Filed Sept. 12, 1966 2 Sheets-Sheet 2

United States Patent Office 3,519,939
Patented July 7, 1970

3,519,939

AUTOMATIC TUNING RECEIVER WITH DETUNING MEANS

Kanichi Tashima, Hirakata-shi, Japan, assignor to Matsushita Electric Industrial Co., Ltd., Osaka, Japan, a corporation of Japan Filed Sept. 12, 1966, Ser. No. 578,689
Claims priority, application Japan, Sept. 21, 1965, 40/58,315; Oct. 1, 1965, 40/60,884; Dec. 3, 1965, 40/75,195
Int. Cl. H03b *23/00;* H03j *3/18, 3/20*
U.S. Cl. 325—318 2 Claims

ABSTRACT OF THE DISCLOSURE

An automatic tuning receiver in which use is made of variable reactance elements, the reactances of which are varied by electric current or potential supplied thereto in order to constitute an antenna input circuit and a local oscillator and an output of a sawtooth wave generator which is controlled by an output of an IF amplifier circuit fed to said variable reactance element so that the receiver may be put in a tuned state, and further in which additional reactance elements are provided along with means for varying the effective reactance of the additional reactance elements whereby the receiver is detuned from the above-mentioned first tuned state and is subsequently brought into another tuned state under control of said IF amplifier.

This invention relates to an automatic tuning receiver wherein a variable capacity element, of which the capacity varies in accordance with applied voltage, or a variable inductance element, of which the inductance varies in accordance with supplied current, is used as a tuning element. More specifically, the present invention relates to an automatic tuning receiver which can receive a radio wave from any desired broadcasting station, utilizing the capacity of a semi-conductor diode, instead of a variable capacitor.

As well known, a radio receiver generally comprises an antenna circuit which catches radio waves radiated from various broadcasting stations, a frequency converter circuit which converts the frequency of the caught signal into certain intermediate frequency, an intermediate frequency amplifier which amplifies the converted signal, a detecting circuit which picks up voice signal, an audio frequency amplifier circuit which amplifies the voice signal to a necessary degree and a speaker which produces sound, and also includes a battery or a power source means which rectifies the voltage of house current lines. Generally, in a radio receiver, a variable capacitor is used both in the antenna circuit and in an oscillator circuit to receive a desired radio wave by varying the capacities of the capacitor. The capacity of each of the capacitors can be varied by rotating the shafts thereof.

According to this invention, selection of broadcasting stations can be performed quite simply, by constructing a receiver with the above-described variable capacity element or variable inductance element as the tuning element, and by connecting an additional coil or an additional capacitor to said tuning element for selecting broadcasting stations. Namely, according to the present invention, a receiver is tuned for a desired frequency after it is once detuned by a certain amount of frequency from a receiving state, by inserting in or cutting off from a resonance circuit said additional coil or said additional capacitor by a change over switch, whereby the resonance constant of a resonance circuit is varied.

Further, according to the present invention, selection of broadcasting stations can be easily performed by operating a controlling circuit for the resonance circuit at a high gain, even when the input for said controlling circuit is decreased owing to detuning of said resonance circuit.

A semi-conductor diode can be used as a variable capacity element because it has a depletion layer between its P-N junction, which forms a capacity between the P-region and N-region, the capacity being able to be controlled by a DC bias voltage applied across the P-N junction. Generally, while a mechanical variable capacity element can vary its capacity by rotating operation thereof, a semi-conductor diode can be varied in its capacity by the applied DC bias voltage. Therefore, a purely electrically automatic tuning radio receiver can be obtained by using a semi-conductor diode of such character in a radio receiver.

An object of the present invention is to provide a radio receiver comprising a resonance circuit wherein a variable reactance element, the reactance of which varies in accordance with applied voltage, is used as a tuning element, said resonance circuit including an additional variable reactance element to be operated at detuning of said receiver to vary the resonance frequency of said resonance circuit.

Other objects and advantages of the present invention will become apparent from a consideration of the following description when taken in conjunction with the accompanying drawings, in which.

Figures 1, 2, 3, 8, 9:
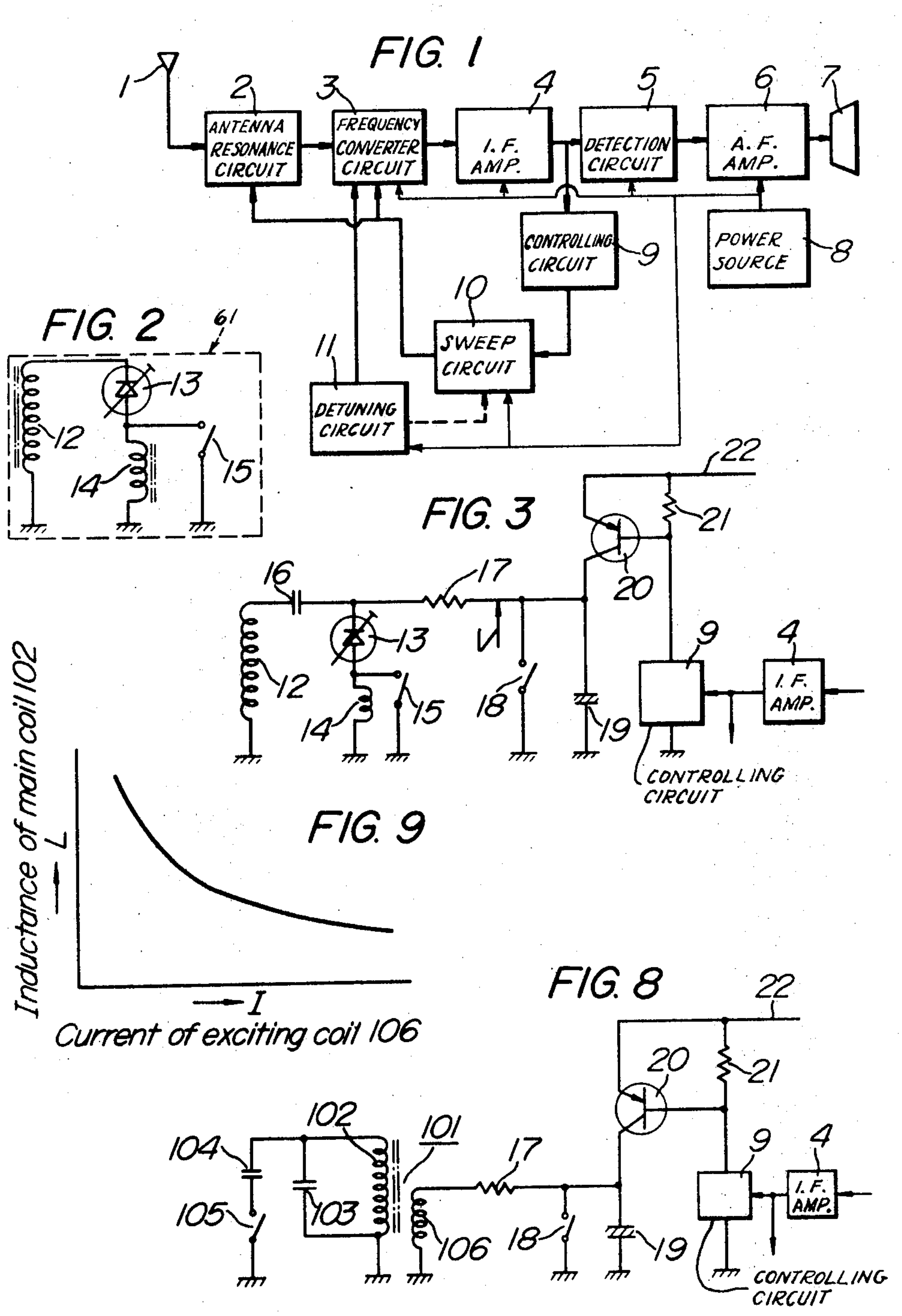
FIG. 1 is a block diagram illustrating the whole constitution of this invention.
FIG. 2 shows a resonance circuit of an oscillator circuit.
FIG. 3 shows a main part of a local oscillator circuit wherein the resonance circuit shown in FIG. 2 is used.
FIG. 8 shows a main part of a local oscillator circuit wherein a variable inductance element is used as a tuning circuit.
FIG. 9 is a characteristic curve of a variable inductance element.

One embodiment of the present invention, namely, the construction of an automatic tuning radio receiver is illustrated in FIG. 1. In FIG. 1, an antenna 1 transmits signals to an antenna resonance circuit 2 comprising a coil and a first variable capacity diode. A signal which is selected by the antenna resonance circuit 2 is converted into an intermediate frequency by a frequency converter circuit 3. The frequency converter circuit includes an oscillator circuit which comprises an oscillation coil 12 and a secondary variable capacity diode 13. The first and second variable capacity semi-conductor diodes 13, each in the antenna resonance circuit 2 and in the frequency converter circuit 3 respectively, are connected in parallel with respect to a DC bias power source, and are applied with a DC bias voltage from a sawtooth voltage generator circuit 60 in a sweep circuit 10. Accordingly, the receiver shown in FIG. 1 is automatically swept through its receiving frequency by the variation of the DC bias voltage from the sawtooth voltage generator. Reference numeral 4 denotes an intermediate frequency amplifier circuit, reference numeral 5 denotes a detection circuit, reference numeral 6 denotes an audio frequency amplifier circuit, reference numeral 7 denotes a speaker, and reference numeral 8 denotes a power source circuit which supplies power to all of the above-described circuits.

On the other hand, an automatic tuning receiver is provided with a controlling circuit 9. Reference numeral 10 denotes a sweep circuit including a sawtooth voltage generator circuit 60 which is controlled by the controlling circuit 9, and supplies DC bias voltages to the first and second variable capacity semi-conductor diodes 13 in the antenna resonance circuit 2 and the frequency converter circuit 3, respectively.

Further, in the present invention, a detuning circuit 11 is provided. The operation of this circuit is to control the respective circuits to receive a radio wave from another broadcasting station different from the broadcasting station which the receiver has been receiving at different time. It might be said that an automatic tuning receiver cannot carry out its function without providing this detuning circuit. In this invention this controlling circuit can operate and, according to this invention, the cotrolling circuit for selecting the broadcasting station operates with a simple circuit and its feature is remarkably improved compared with conventional systems.

In this invention there can be obtained a controlling circuit for selecting broadcasting stations in an automatic tuning radio receiver which receives the desired broadcast by automatically sweeping the received frequency wherein a variable capacity diode is used both in an antenna circuit and in an oscillation circuit.

According to this invention a coil 14 of small inductance is inserted in the resonance circuit 61 of the frequency converter circuit 3 of an automatic tuning receiver, comprising an oscillation coil 12 and a variable capacity diode 13, as shown in FIG. 2.

In this invention the above-described function can be obtained by varying mechanically or electrically, the inductance of the coil 14 which has a small inductance value. FIG. 2 shows a resonance circuit 61 in an oscillator circuit of a radio receiver. As a general rule, besides the parts shown in FIG. 3, a transistor, a vacuum tube, a plurality of resistors, a capacitor and an intermediate frequency transformer and so on are associated with the operation as a frequency converter circuit. This circuit comprises, referring to FIG. 3, an oscillation coil 12, a variable capacity diode 13 and an additional coil 14, and a switch 15, which is operated mechanically or electrically, is also provided. Further, a controlling circuit 9 and a sweep circuit 10 and so on are provided as shown in FIG. 3. In FIG. 3, reference numeral 16 denotes a DC-blocking condenser and 17 denotes a DC coupling resistor. A transistor 20, which is connected to a power source 22, supplies a DC current to a condenser 19 which is connected to the collector of the transistor 20. The above-described controlling circuit 9 is connected to the base circuit of the transistor 20.

Figure 4:
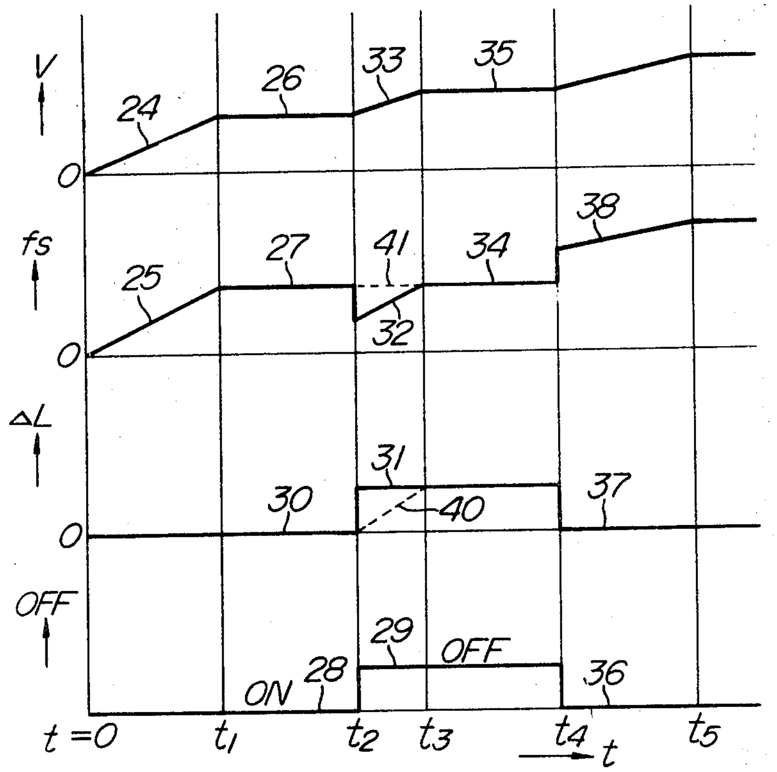
FIG. 4 illustrates the principle of the operation of the circuit shown in FIG. 3.

In the circuit illustrated in FIG. 3, when the switch 15 is on, the voltage across the capacitor 19 increases as shown by 24 in FIG. 4. As a result, the DC bias applied to the variable capacity diode 13 increases in opposite direction, and the capacity of the diode 13 decreases. Accordingly, the oscillation frequency becomes successively higher as shown by 25 in FIG. 4, and reaches a desired frequency at time $t_1$. Then, naturally, a signal appears in the intermediate frequency amplifier circuit 4. The otuput of the controlling circuit 9 operates to decrease the current through the collector of the transistor 20 when the signal is applied to the controlling circuit 9. As a result, the charging operation of the condenser 19 ceases, and the voltage of the condenser 19 is maintained at a constant value 26, and the oscillation frequency is also maintained constant as shown by 27 in FIG. 4. It is apparent that such an automatic tuning receiver continues to receive a radio wave of a certain frequency. In an electronic automatic tuning receiver of this type, a controlling circuit such as indicated by 9 in FIG. 3 is always operative, so that if the inductance of the coil 12 is changed, due to a temperature change, the controlling circuit 9 readily begins to operate to vary the collector current of the transistor 20 to thereby change the bias voltage to the variable capacity diode 13 to change the capacitance of the diode 13 counter-actively so as to control the oscillation frequency of the frequency converter circuit 3 and to maintain reception of the radio wave from the same broadcasting station. In order to receive a radio wave from another broadcasting station, a detuning means such as constituted by the additional coil 14 and the switch 15 is necessary. Without the detuning means, the receiver would not be able to receive any radio wave other than that from a broadcasting station which is being received. For the reception of a radio wave from a different broadcasting station, it is necessary, in principle, to stop the operation of the controling circuit 9 for a while so that the transistor 20 may operate to increase the voltage across the capacitor 19 to vary the capacitance of the variable capacity diode 13 thereby changing the oscillation frequency of the converter circuit 3. However, there arises a problem of adjusting the time for which the controlling circuit has to be non-operative. Such adjustment cannot be performed manually. In the present invention, as briefly mentioned, the additional coil 14 and the switch 15 are provided to constitute a detuning means for performing the objects of the present invention.

On the other hand, this invention relates to the operation of a radio receiver to receive a radio wave of higher frequency than that which has been received from time $t_1$ to time $t_2$, and provides a circuit which can attain the above object by varying the inductance of the coil 14 stepwisely or slowly by controlling mechanically or electrically the switch 15.

Assuming that the switch 15 is turned over from ON to OFF at time $t_2$, the manner of the operation is shown by 28 and 29 in FIG. 4. As a result, the inductance of the coil 14 is increased from zero to ΔL, as indicated at 31. Then the oscillation frequency (or the receiving frequency) is varied by $$\Delta f=\frac{1}{2\pi\sqrt{(L+\Delta L)\cdot C}}-\frac{1}{2\pi\sqrt{LC}}<0 \qquad (1)$$

where L designates the value of inductance of the oscillation coil 12 and C designates the value of capacitance in a DC bias voltage 26 of variable capacity diode 13.

Thus, the oscillation frequency is suddenly decreased by $\Delta f$. Accordingly, the signal from the intermediate frequency amplifier circuit disappears, and the current through the collector of the transistor 20 increases, and the voltage of the capacitor 19 increases as shown by 33 in FIG. 4.

Then at time $t_3$, the oscillation frequency increases to the original frequency as shown by 34. By this time, however, the capacity of the diode 13 is decreased from C to C′ owing to the variation of the DC bias voltage from 26 to 35. As the result, the oscillation frequency is apparently as follows:

$$f=\frac{1}{2\pi\sqrt{LC}}-\frac{1}{2\pi\sqrt{(L+\Delta)\cdot C'}} \qquad (2)$$

where C′ designates the value of capacitance in DC bias voltage 35 of variable capacity diode 13.

Assuming that this state is maintained to time $t_4$. When the switch is turned ON at time $t_4$ as shown by 36, the inductance $\Delta_L$ of the coil 14 suddently becomes zero as shown by 37. As a result, the oscillation frequency increases suddenly by $$\Delta f'=\frac{1}{2\pi\sqrt{L\cdot C'}}-\frac{1}{2\pi\sqrt{(L+\Delta L)\cdot C'}}>0 \qquad (3)$$

Thus the receiver can be detuned from the broadcast which has been received by the receiver. It can not be said too much that the problem of the operation of selecting broadcasting stations or the operation of detuning in an automatic tuning receiver is solved only by this process.

As explained above, according to this invention, an effect is obtained in the detuning operation of an automatic tuning receiver by electrically sweeping with the use of a variable capacity diode and a variable inductance coil. A switch 18 is a short circuiting switch to make the voltage across the condenser 19 zero. By operating the switch 18, the receiver can be changed from a state wherein a higher frequency radio wave is received to another state wherein a lower frequency radio wave is received.

Figures 5, 6, 7:
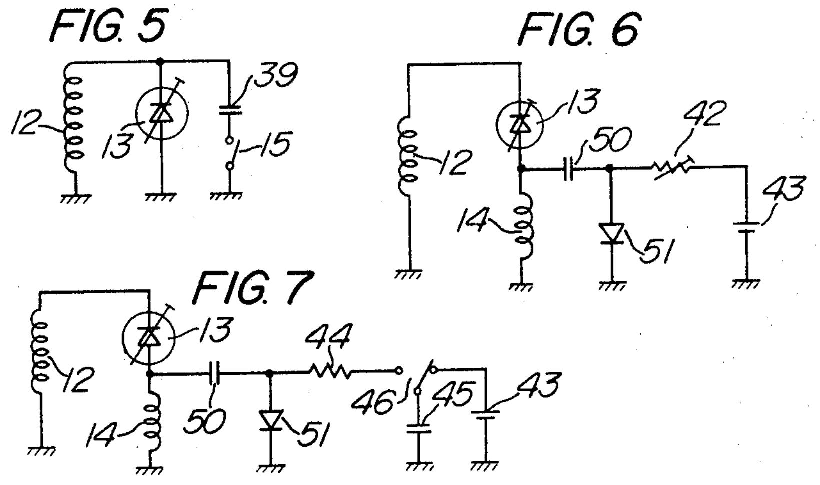
FIGS. 5 to 7 illustrate other embodiments of the resonance circuit, respectively.

In the above explanation, the coil 14 of small inductance is inserted in series with the oscillator circuit comprising the oscillation coil 12 and the variable capacity diode 13, and is varied its inductance by the ON-OFF operation of the switch 15. However, a similar effect can be obtained by inserting an additional capacitor 39 as shown in FIG. 5. The ON-OFF operation of the switch 15 in FIG. 5, wherein the additional capacitor 39 is inserted, will effect the variation in the oscillation frequency by $\Delta f$ in the same manner as the ON-OFF operation of the switch 15 in FIGS. 2 and 3 wherein the additional coil 14 is inserted. Thus, it has been made apparent that the effect of this invention can be obtained either by controlling an additional coil or by controlling an additional capacitor with a switch.

In the above explanation, the additional coil 14 is varied in its inductance stepwisely by a switch; however, a similar effect can be obtained by varying the inductance of the coil slowly. When the inductance of the coil 14 is gradually increased by mechanical or electrical link motion with the switch 15 from time $t_2$, then the inductance of the oscillator circuit increases gradually, and the oscillation frequency lowers gradually. As a result, the input to the controlling circuit 9 decreases, and the current through the collector of the transistor 20 increases accordingly. Then the voltage across the condenser 19 increases and the capacity of the diode 13 decreases, and thus the oscillation at the same frequency is maintained. This manner of operation is shown by 40, and the receiving frequency is as shown by 41. As a result, L is changed to $L+\Delta L$, and C is changed to $C'$. This state is the same at time $t_3$ as described above. At time $t_4$, the oscillation frequency can be suddenly detuned by $\Delta f$ by making the inductance of the coil 14 zero, which has been increasing, by the link motion with the switch 15. Thus the object of this invention can be reached by the link motion with the switch 15, whereby the inductance of the coil 14 is firstly increased gradually and then is suddenly decreased to zero.

On the contrary, a detuning operation can be performed by turning the switch 15 ON only when it is desired to detune from the broadcast which has been received, during the receiving of said broadcast the switch 15 being maintained OFF. This manner of operation is shown by 34 and 38.

In the above description, the operation for detuning an automatic tuning receiver wherein the coil 14 of small inductance or the capacitor 39 of small capacity is connected to the oscillator circuit which includes the oscillation coil 12 and the variable capacity diode 13 has been examined.

One of the various embodiments to work the operation for detuning of the automatic tuning receiver of this invention will be explained hereinafter.

In FIG. 6, for example, a series circuit of a coupling condenser 50 and a diode 51 is connected in parallel with a coil 14 and a power source 43 is connected to the junction of the condenser 50 and the diode 51 through a variable resistor 42. The coil 14 is conected in series with the oscillation coil 12 and the variable capacity diode 13. Generally, it is well known that the resistance of a semiconductor diode is varied in accordance with a forward DC bias current flowing therethrough. Accordingly, by controlling the current to be supplied to the diode by the variable resistor 42, by electrical coupling of the diode 51 in parallel with the coil 14, the equivalent inductance of the coil 14 is controlled.

A similar effect can be obtained by the circuit shown in FIG. 7, wherein a resistor 44 is connected to a capacitor 45 of large capacity, the capacitor 45 being precharged, and the inductance of the coil 14 is electrically and continuously varied by supplying the discharge current of the capacitor 45 to the diode 51.

There are various methods for varying the inductance of the coil 14 or the capacity of the capacitor 39, and those should be considered to be included in the present invention.

In the above description, a novel process for detuning an automatic tuning receiver by adding an additional coil or an additional capacitor to the oscillator circuit is explained. According to this novel process, the desired detuning operation is performed by varying only the oscillation frequency stepwisely or slowly. In this case, only the oscillation frequency, namely, the receiving frequency is varied, while the tuning frequency of the antenna circuit which constitutes normally an antenna coil and a first variable capacity diode is not artificially varied. Therefore, the following troubles may occur in case the coil 14 of small inductance is connected to the oscillation circuit:

In FIG. 4, the coil 14 is not connected to the oscillator circuit from time $t_1$ to time $t_2$ (that is, $\Delta L=0$), the receiving frequency 27 is the difference between the oscillation frequency and the intermediate frequency. Accordingly, at this time, the tuning frequency of the antenna circuit is the same as the receiving frequency 27. At time $t_2$, the coil 14 is connected to the oscillator circuit, then the received frequency 34 at time $t_3$ is the same as the receiving frequency 27, while the total inductance of the oscillation coil is increased to $L+\Delta L$ from L. Thus the receiving condition is satisfied only when the capacity of the variable capacity diode 13 is slightly decreased to $C'$ from C. Accordingly, the capacity of the first variable capacity diode, which is DC coupled in parallel in the antenna circuit, is decreased compared with the capacity thereof during the period of from time $t_1$ to $t_2$. By this fact, the difference between the receiving frequency and the tuning frequency is zero during the period of from time $t_1$ to $t_2$. However, the tuning frequency is higher than the receiving frequency during the period of from time $t_3$ to $t_4$. In this case, the antenna gain lowers in the tuning circuit or antenna circuit. If the antenna gain lowers in the antenna circuit, then the receiving of the frequency 34 may fail. In this case, the desired object cannot be reached.

For the purpose of preventing the above trouble, the controlling circuit 9 is controlled by the link motion with the switch 15 to increase the gain of control of the controlling circuit 9, and thus the receiving of the frequency 34 can be performed exactly.

In the above description, one embodiment of this invention, wherein a variable capacity diode is used as a tuning element, has been explained. However, the similar effect can be obtained by using a variable inductance element, the inductance of which varies according to the current flowing therethrough instead of the variable capacity diode.

FIG. 8 shows another embodiment wherein the variable inductance element is used. In FIG. 8, the same reference numerals are attached to the parts similar to those in FIG. 3. In FIG. 8, a capacitor 103 is connected to a main coil 102 which constitutes a variable inductance element 101, and an additional capacitor 104 is connected in series with the main coil 102, the additional capacitor 104 being connected to or opened from the main coil 102 by a switch 105, and an exciting coil 106, which constitutes the variable inductance element 101, is coupled magnetically with the main coil 102, and the exciting coil 106 is connected to the collector of a transistor 20 through a DC coupling resistor 17.

The operation of this circuit will be explained briefly. A current, which has the value of the voltage across the condenser 19 divided by the resistance of the DC coupling resistor 17, flows through the exciting coil 106. A current flows through the main coil 102 by the exciting current flowing through the exciting coil 106, and the inductance of the main coil 102 varies in accordance with the current therethrough. When the current increases successively as shown by the abscissa in FIG. 9, then the inductance of the main coil 102 decreases successively owing to magnetic saturation, as shown by the ordinate in FIG. 9.

Assume that the switch 105 is turned from OFF to ON to receive a higher frequency than the frequency which has been received. Then the oscillation frequency of the oscillator circuit lowers suddenly by the amount cordesponding to the additional capacitor 104. On the other hand, since the intermediate frequency signal is not supplied to the transistor 20 owing to the drop of the oscillation frequency, the current through the collector of the transistor 20 increases, and charges the capacitor 19 accordingly. Then the current flowing through the exciting coil 106 increases, and thus the inductance of the main coil 102 successively decreases, tending to receive the originally received certain frequency. When the switch 105 is turned OFF at the state wherein the certain frequency being received, the capacity of the oscillation circuit is decreased by the capacity of the additional capacitor 104, and as a result, the state of the receiver is shifted to the state to receive a higher frequency from the state to receive the certain frequency.

As described above, according to this invention, an automatic tuning receiver, which can select broadcasting stations by simple operations and operates exactly is obtained, wherein either a variable inductance element, the inductance of which varies in accordance with current therethrough, or a variable capacity element, the capacity of which varies in accordance with the voltage applied thereon, is used as a tuning element.

What is claimed is:

1. In an automatic tuning receiver having an antenna input circuit and a frequency converter circuit which includes a local oscillator, each of said antenna input circuit and said local oscillator circuit having a resonant circuit, at least the resonant circuit in said local oscillator circuit being constituted by a variable reactance element the reactance of which is varied by either one of an electric current flowing through said element and an electric potential applied to said element, and said element being supplied with an output of sawtooth wave generator circuit which is controlled by an output of an IF amplifier circuit to effect an automatic scanning so that the receiver may be automatically placed in one tuned state to receive a particular broadcast signal, the improvement consisting in providing an additional reactance element to said variable reactance element in said local oscillator circuit and in providing means for varying such an effective reactance of said additional reactance element that contributes to determination of a resonant frequency of its associated circuit whereby the receiver is detuned from said one tuned state and is subsequently brought into another tuned state by an operation of automatic scanning by means of said sawtooth wave generator under control of said IF amplifier circuit, said additional reactance element being an inductive element, and said effective reactance varying means including a series circuit of a DC blocking capacitor and a semiconductor diode, said series circuit being connected across said inductive element and a DC power supply means connected to said semiconductor diode through a variable capacitor so that the effective inductance of said inductive element may be varied depending upon the amount of current fed by said DC power supply means and flowing through said semiconductive diode.

2. In an automatic tuning receiver having an antenna input circuit and a frequency converter circuit which includes a local oscillator, each of said antenna input circuit and said local oscillator circuit having a resonant circuit, at least the resonant circuit in said local oscillator circuit being constituted by a variable reactance element the reactance of which is varied by either one of an electric current flowing through said element and an electric potential applied to said element, and said element being supplied with an output of sawtooth wave generator circuit which is controlled by an output of an IF amplifier circuit to effect an automatic scanning so that the receiver may be automatically placed in one tuned state to receive a particular broadcast signal, the improvement consisting in providing an additional reactance element to said variable reactance element in said local oscillator circuit and in providing means for varying such an effective reactance of said additional reactance element that contributes to determination of a resonant frequency of its associated circuit whereby the receiver is detuned from said one tuned state and is subsequently brought into another tuned state by an operation of automatic scanning by means of said sawtooth wave generator under control of said IF amplifier circuit, said additional reactance element being an inductive element and said effective reactance varying means including a series circuit of a DC blocking capacitor and a semiconductor diode, said series circuit being connected across said inductive element and a charge-discharge capacitor associated with said semiconductor diode so as to flow a charge-discharge current through said semiconductor diode depending upon which the effective inductance of said inductive element is varied.

References Cited

UNITED STATES PATENTS

| | | | |
|---|---|---|---|
| 2,706,777 | 4/1955 | Lutz | 325—471 XR |
| 3,376,508 | 4/1968 | Jones | 325—462 |
| 3,249,876 | 5/1966 | Harrison | 331—36 XR |
| 3,316,498 | 4/1967 | Doble | 331—36 XR |

ROBERT L. GRIFFIN, Primary Examiner

H. W. BRITTON, Assistant Examiner

U.S. Cl. X.R.

307—320; 325—422, 470; 331—36; 334—15